(12) United States Patent
Li et al.

(10) Patent No.: US 8,936,831 B2
(45) Date of Patent: Jan. 20, 2015

(54) METHOD FOR FLUIDIZING AND COATING ULTRAFINE PARTICLES, DEVICE FOR FLUIDIZING AND COATING ULTRAFINE PARTICLES

(75) Inventors: Jie Li, Darien, IL (US); Yung Y. Liu, Hinsdale, IL (US)

(73) Assignee: UChicago Argonne, LLC, Chicago, IL (US)

( * ) Notice: Subject to any disclaimer, the term of this patent is extended or adjusted under 35 U.S.C. 154(b) by 215 days.

(21) Appl. No.: 13/366,162

(22) Filed: Feb. 3, 2012

(65) Prior Publication Data
US 2013/0202790 A1    Aug. 8, 2013

(51) Int. Cl.
| | | |
|---|---|---|
| B05D 7/00 | (2006.01) | |
| B05D 1/24 | (2006.01) | |
| B05B 17/00 | (2006.01) | |
| B01J 8/18 | (2006.01) | |

(52) U.S. Cl.
USPC ............... 427/213; 427/185; 239/1; 422/139

(58) Field of Classification Search
CPC .............. B01J 8/24; B01J 2/16; B01J 8/44; B05D 1/24; B05D 1/22; B05C 19/02; B05C 19/025; B05B 7/14; B05B 7/1404
USPC ........... 427/213, 185, 459; 118/308; 422/139; 239/1
See application file for complete search history.

(56) References Cited

U.S. PATENT DOCUMENTS 4,879,011 A * 11/1989 Schram ................... 204/157.42

OTHER PUBLICATIONS

Fan et al. "Convergence of Fine Particles Under Standing-wave Condition" School of Energy and Environment, Nanjing City, P R China, 2010, pp. 1-4.*
Kavouras et al. "Ultrasonic Levitation for the Examination of Gas/Solid Reactions", Review of Scientific Instruments, vol. 74, No. 10, Oct. 2003, pp. 4468-4473.*
J. Li, et al., Periodic and Disordered Structures in a Modulated Gas-Driven Granular Layer, Physical Review Letters, vol. 90, No. 13 (Apr. 20, 2003), pp. 134301-1 to 134301-4.
Hsiaotao T. Bi, A critical review of the complex pressure fluctuation phenomenon in gas-solid fluidized beds, Chem. Engineering Science 62 (2007), pp. 3473-3493.

* cited by examiner

Primary Examiner — Timothy Meeks
Assistant Examiner — Ann Disarro
(74) Attorney, Agent, or Firm — Cherskof Flaynik & Gurda, LLC

(57) ABSTRACT

The invention provides a method for dispersing particles within a reaction field, the method comprising confining the particles to the reaction field using a standing wave. The invention also provides a system for coating particles, the system comprising a reaction zone; a means for producing fluidized particles within the reaction zone; a fluid to produce a standing wave within the reaction zone; and a means for introducing coating moieties to the reaction zone. The invention also provides a method for coating particles, the method comprising fluidizing the particles, subjecting the particles to a standing wave; and contacting the subjected particles with a coating moiety.

14 Claims, 7 Drawing Sheets

METHOD FOR FLUIDIZING AND COATING ULTRAFINE PARTICLES, DEVICE FOR FLUIDIZING AND COATING ULTRAFINE PARTICLES

CONTRACTUAL ORIGIN OF THE INVENTION

The U.S. Government has rights in this invention pursuant to Contract No. DE-AC02-06CH11357 between the U.S. Department of Energy and UChicago Argonne, representing Argonne National Laboratory.

BACKGROUND OF THE INVENTION

1. Field of the Invention

This invention relates to the production of coatings onto particles, and more particularly, this invention relates to the production of conformal coatings onto particulate substrates.

2. Background of the Invention

Optimization of reaction surfaces is key to more efficient chemical reactions. The more controlled the catalytic interface, the more leveraged are the effects of electron confinement.

Well-controlled reaction surfaces would increase efficiencies in catalysis, energy production and energy storage. In the lithium ion battery market alone, the global U.S. dollar sales are projected to double by 2016. These sales will be concomitant with the attainment of higher efficiencies.

Lithium ion batteries for future plug-in hybrid electric vehicles will require high working voltages, on the order of about 5 volts. The advantages of these high volt chemistries include the utilization of relatively lower cost Lithium- and Manganese-containing spinels, such as $LiMn_2O_4$, immersed in electrolyte. Manganese systems are less costly and less polluting than cobalt-containing systems.

Problems abound for electrolyte-based systems. For example, structures physically immersed into the electrolyte are inevitably attacked by the surrounding electrolyte though redox chemical reactions. This significantly shortens the battery life and, even worse, creates explosion hazards.

Also, the sought-after high voltages of advanced battery systems often exceed the electrochemical resistance of electrolyte oxidation; as such, irreversible capacity degradation occurs whereby the electrolyte is compromised. This is due mainly to the high temperatures (more than 55° C.) generated and also due to the electrodes, such as high surface area spinels, reacting with the electrolyte. Specifically, at target voltages and the accompanying temperature increases, the manganese in the spinels plate on the anodes, thereby decreasing recharge capacity.

The use of high surface area materials as reaction surfaces is widespread, particularly in catalytic sciences. However, in electrochemical applications, the aforementioned degradation of electrodes and electrolyte is problematic. A possible way to prevent this degradation is by coating the aggregate. A myriad of attempts to coat aggregate include, sol-gel methods and chemical vapor deposition. However, most of these techniques are relegated to situations where the geometries of the host objects are flat, or large particles, and particularly, when the uniformity and layer thickness of the coating layers are not concerns.

When the size of host particles is reduced to the micro- or nano-scale, physical properties of the coating layer, mainly uniformity and thickness, need to be precisely controlled in order to manipulate ion and electron transport behaviors crossing the interparticle interface. The above-mentioned state of the art coating techniques fall short of these objectives.

Generally, the smaller the aggregate, the more valuable it is as a reaction surface medium. However, particles with diameters less than about 20 micrometers (i.e. microns or µm) show strong flow instability when placed in a flowing medium, such as a fluidized bed, for mixing. This is due to strong inter-particle forces which exist among ultra-fine particles. These forces include van der Waals- and electrostatic-forces. Gas tunneling, particle bridging, and clustering during suspension are common during mixing and fluidization of ultra-fine particles. FIG. 1A is a prior art picture of three fluidization beds, demonstrating clustering (on left-hand side), particle bridging (middle), and gas tunneling (right-hand side). As a result, fluidizing gas quickly passes through the bed via the empty channels. Meanwhile the dense powder regions which comprise the interior bulk of those channel structures remain static. This "polar structure" phenomenon prevents intimate gas-solid contact, the related heat/mass transfer process, and the gas-solid phase reactions sought.

A need exists in the art for a method to economically process ultra fine particles (i.e., those particles less than about 100 microns in diameter, and more commonly less than 20 microns in diameter). The method should eliminate the need for repetitive equipment motion (such as mixing, shaking or agitating) so as to effectively save energy, thereby allowing for an economical process scale-up. Also the method should assure the formation of conformal coatings to the entire surface of each of the particles.

SUMMARY OF INVENTION

An object of the invention is to provide a method for coating particles that overcomes many of the disadvantages of the prior art.

Another object of the invention is to provide a method for dispersing particles in a fluid. A feature of the invention is the use of standing waves to facilitate homogeneous suspension of the particles in the fluid. An advantage of the method is the elimination of isolated regions of particles, thereby assuring each particle is exposed to the fluid.

Yet another object of the present invention is to provide a device for uniformly dispersing ultrafine particles in gas flows. A feature of the invention is the use of oscillating fluids as the sole means for homogeneously fluidizing the particles within a reaction chamber such that the energy generated is confined within the resonant (i.e., reactant) chamber. As compared to the prior art fluidizers of FIG. 1A, the fluidized powders of the present invention homogeneously disperse throughout the reaction chamber as can be seen in FIG. 1B. An advantage of the invention is that the elimination of chamber movement saves energy.

Still another object of the present invention is to provide a method for coating porous particles, each particle which is less than about 50 microns in diameter and typically below about 20 microns in diameter. A feature of the method is the use of a standing wave to keep the particles (including porous materials) homogeneously fluidized. An advantage of the invention is that it renders all of the particles accessible to coating moieties such that substantially the entire surface of the porous material is coated to prevent unwanted reactions of exposed particle surface with the environment of the particle. In an embodiment of the invention, the standing wave comprises the coating moieties some of which eventually form the coating on the fluidized substrates.

Another object of the present invention is to provide a conformal coating onto a substrate. A feature of the invention is that the substrate comprises a particle which measures less than about 20 μm in diameter, wherein the substrate is completely encapsulated in an oxide via atomic layer deposition. An advantage of the invention is that the resulting conformal and pin-hole free coating, with both film thickness and composition precisely controlled, exhibits superior performance compared to coated substrates produced via random processes.

Yet another object of the present invention is providing optimized electrode-electrolyte interfaces in batteries. A feature of the invention is that cathodes are coated (no thicker than 20 nanometers, and preferably from about 0.1 to 10 nanometers) with material which prevents unwanted side reactions such as migration of metal ions. An advantage of the invention is the preservation of recharging capacities.

Briefly, the invention provides a method for dispersing particles within a reaction field, the method comprising confining the particles to the reaction field using a standing wave.

The invention also provides a system for coating particles, the system comprising a reaction zone; a means for producing fluidized particles within the reaction zone; a fluid to produce a standing wave within the reaction zone; and a means for introducing coating moieties to the reaction zone. In an embodiment of the invention, the coating moieties comprise at least a portion of the standing wave.

The invention also provides a method for coating particles, the method comprising fluidizing the particles, subjecting the particles to a standing wave; and contacting the subjected particles with a coating moiety.

BRIEF DESCRIPTION OF DRAWING

The invention together with the above and other objects and advantages will be best understood from the following detailed description of the preferred embodiment of the invention shown in the accompanying drawings, wherein.

DETAILED DESCRIPTION OF THE INVENTION

Figure 1A:
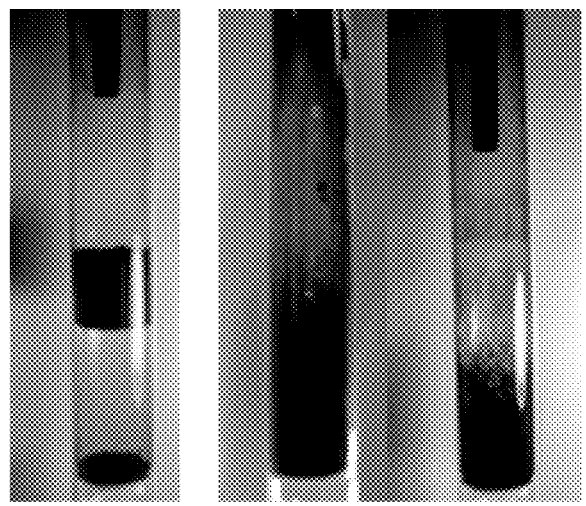
FIG. 1A is a picture of the poor fluidization problems of prior art fluidization beds.
Figure 1B:
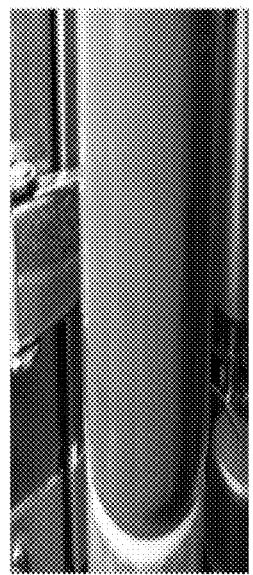
FIG. 1B is a picture of a homogeneously fluidized bed operating in accordance with the features of the present invention.

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The present invention provides a method for producing functionalized particle surfaces. Functionalized surfaces can be classified into two categories: one is passivation wherein the particle surface is treated such that undesirable reactions and/or related environmental attacks can be prevented. The other is activation wherein the surface is enabled for various desirable reactions to adapt it to other materials, like a polymer, metal, semiconductor and/or ceramic materials. For example, $LiCoO_2$ or $LiMn_2O_4$ powders are an ideal cathode material for the application of a high efficiency Li-ion battery.

Part of the process for providing functionalized particle surfaces requires manipulating the particle so as to expose it to reactive moieties. Particle manipulation is achieved via application of a coherently controlled gas fluidized bed reactor. (Coherent application relates to the insertion of, or the production of, a plurality of waves within the reaction zone such that the inserted wave fluid has a direction, amplitude and phase that is similar to that of fluidized reaction mixture within the chamber, thereby causing interference with that mixture.) This results in fluidized bed intensification and ensuing synchronized suspended particles.

Reactor bed intensification facilitates dispersal and general refining of particles within the range of the nanometer scale, (e.g., the Group C powder as defined in the Geldart particle classification). An embodiment of the invention facilitates dispersal and general refining of particles less than about 100 μm in diameter, preferably less than about 20 μm in diameter, and most preferably between 10 nm and 15 μm. Such ultra fine particles are used to make cathodes (such as $LiMn_2O_4$ particles at size ranges of 5 to 10 microns) and anodes (such as graphite particles having diameters of between approximately 5 to 20 microns). Ultra capacitors made of metal oxide-coated ultra fine particles (ranging in size from about 200 to 500 nm) provide higher energy storage capacity compared to conventional plate capacitors. Also, passivation coating of photovoltaic material on semiconductor nanoparticles results in high efficiency solar cells and LEDs.

The fluidized bed intensification facilitates coating of the particles, such that the coatings (affected via for example atomic layer deposition) range in thickness from about 1 to 10 nanometers. The incorporation of these nano-sized reaction centers, particularly at electrode-electrolyte interface in batteries, optimizes the chemical stability of the electrode at these interfaces. For example, the inventor found that the resulting thin film resulted in about a 2 to 8 fold (as measured by electrochemical impedance spectrometry) increase in Li ion transport across the film, compared to similar sized electrode/electrolyte configurations. In addition, the invented coating method provides a means for eliminating secondary or side reactions at the electrode-electrolyte interface of batteries. Such unwanted reactions include, for example, the aforementioned, catalytically-driven decomposition of electrolyte.

The present invention provides a process for encapsulating electrode grains with either an inorganic or an organic phase so as to prevent the aforementioned electrolyte breakdown, particularly at the positive electrode interface. An exemplary application of this process is the encapsulation of the spinel LiMn$_2$O$_4$ with metal oxides such as ZrO$_2$ or Al$_2$O$_3$ so as to minimize the surface area of the active material in contact with the electrolyte. A means for coating the spinel is atomic layer deposition (ALD).

The encapsulation facilitated by the present technique results in continuous coatings over substantially the entire surface of the spinel such that no gaps exist. The continuous coating isolates the spinel so that no direct physical contact occurs between the spinel and the electrolyte or no fluid communication exists between the surface of the spinel and environment. The conformal metal oxide coatings (preferably comprised of ionically-conductive coating materials) thus formed allow easy diffusion of Li-ions, yet are thin enough to allow electron transport. (Conformal coatings are those in which the coating is uniform across the surface of the particle so that the surface shape of the coated substrate closely resembles that of the underlying substrate surface.)

The coatings prevent Mn ions from leaving the cathode and therefore prevent cathode distortion. Some coatings generated by the invented process slow Mn ion migration from the cathode, thereby allowing Li ions to reach the anode first. The invention enables the layer thickness to be tuned, such that coating thicknesses are less than about 20 nm, preferably between about one half a nm and 20 nm, and most preferably between about 1 nm and 5 nm. In one embodiment, Li ions transport across the film which is coating the cathode, contrary to a conventional self-generating film on the same electrode.

Figure 1C:
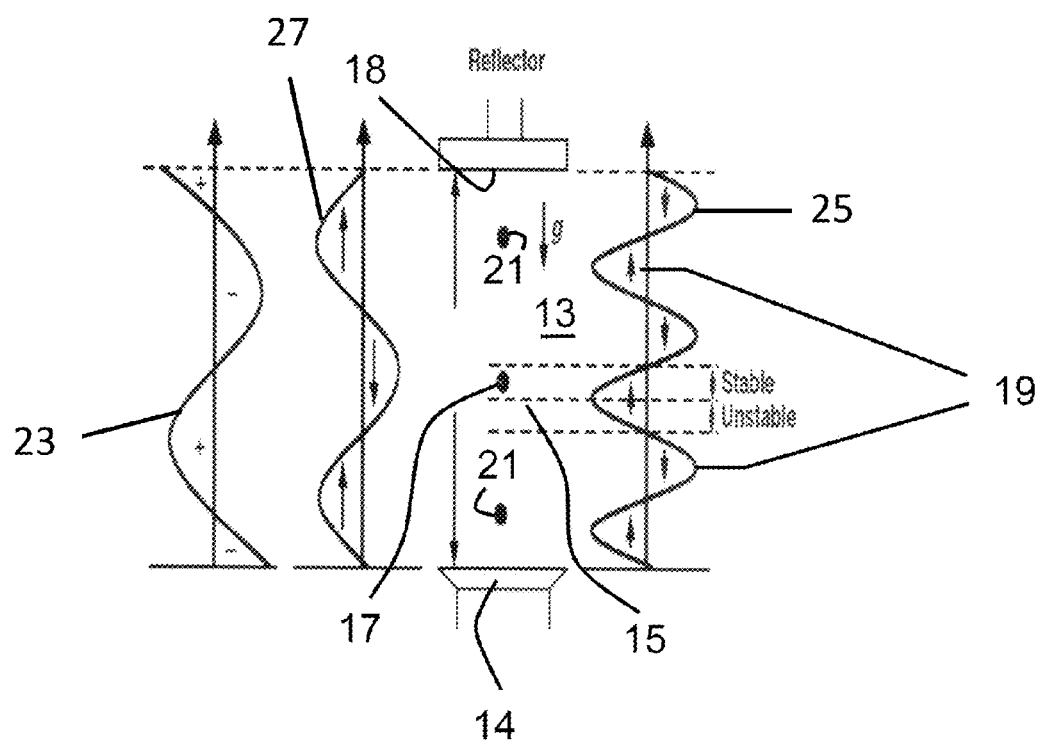
FIG. 1C is a schematic drawing of the invented method, in accordance with features of the present invention.

FIG. 1C provides a schematic diagram of the invention for deep gas-fluidized bed reactors. (Deep beds are defined as having a bed height to column diameter ratio greater than 1.) Generally, particles to be coated are suspended within the confines 13 of a housing. A means for providing particle suspension includes a standing wave assisted gas-solid flow field 15. In an embodiment of the invention, the particles are relegated at a pressure node 17, defined as where the local wave pressure 23 and levitation force 25 of the gas-solid liquor is zero, while the local wave velocity 27 is maximal. This region of the wave field enables stable levitation. This satisfies Bernoulli's principle of energy balance. Because the levitation force 25 acting on each particle depends on this particle's location, and is directed toward the nearest pressure node, 17, 21, the region of the wave field near the pressure node enables stable particle levitation. Particularly, the radiation or levitation force is much larger in standing than in running waves.

Other pressure nodes 21 within the wave field flank the stable wave field pressure node 17. Levitation forces 19 act in the direction of these flanking pressure nodes to produce stable levitation by upward or downward flow.

A vortex structure (not shown) is generated locally, due to uneven pressure distribution, when enough particles are present.

The inventor has discovered a sequence of well-defined transitions between disordered states dominated by bubbling instabilities and ordered periodic sub-harmonic patterns as the frequency, the amplitude of modulation and the fluid flow rate are varied. These transitions occur for both deep beds and shallow beds. The observed ordered states for the shallow bed include periodic squares, stripes and some more complicated structures. The pattern wavelength is determined by the frequency of the modulation of the mean flow rate, as further discussed in J. Li, I. S. Aranson, W. K. Kwok, and L. S. Tsimring, Phys. Rev. Lett. 90 (2003) 134301, the entirety of which is incorporated by reference. The transition to periodic patterns is associated with a decrease of the gas pressure difference across the bed, suppressing the formation of large gas bubbles.

Specifically, the inventor found that when a fluid flow is superimposed on a granular bed layer, wherein the frequency of the fluid flow is substantially similar to the fluidization frequency of the bed layer, pattern formations in the bed layer occur. The flowing fluid (such as an inert gas like nitrogen or argon) contacts the bed layer at the bed's natural undulating rhythm to provide particle dispersion while concomitantly minimizing interparticle collisions.

The invention provides a new methodology to disperse particles in a gas flow, which is based on the spatial/time regulation function of a standing wave of pressure that can be generated by resonance between a modulated gas flow and its reflected wave from a reflector installed at the top of the bed. A uniform gas fluidization of ultrafine powders is achieved as well in a deep fluidized bed by implementing the invented method.

Gas Fluidized
Reactor Detail

Generally, an exemplary device to facilitate the invented particle coating method comprises a housing. A first end of the housing is adapted to receive compressed gas. As such, proximal to and interior of that first end is constructed a porous plate 14 to provide an approximately uniform gas distribution. In an embodiment of the device, the porous plate is covered by thin metal mesh with the hole size smaller than the diameter of the granular particle. This mesh size provides a means to prevent the fluidized particles from clogging the plate. However, if the plate is sintered, no mesh is required inasmuch as the inventors have found that sintered plates provide well-controlled pore sizes. If the right grade of pore size is selected, the particles (which often exist as clusters) will not plug the pores. For example, the 10 micron diameter pores of sintered plates have never plugged during inventors' experiments. Particles to be coated are placed above the plate, and above the mesh in instances where mesh is also used. Optionally, packed rings are randomly situated below the plate for flow pre-distribution. These rings prevent gas from ejecting directly to the center of the gas-fluidized bed reactor. In an embodiment of the invented device, rings are piled on top of each other to form zig-zagged passageways to serve as a means for uniformly distributing the fluidizing gases before the gases contact the plate. The rings are comprised of any material such as glass or ceramic or stainless steel, or any other substance inert to the precursors used in the coating process.

Dry compressed gas is pumped through the particle layer, and the flow rate is controlled by a proportional valve with a very short response time. The flow velocity is periodically modulated using the proportional valve. The fluidization efficiency is monitored by measuring the pressure drop across the bed and/or by analyzing the surface modulation of the bed.

Figure 2:
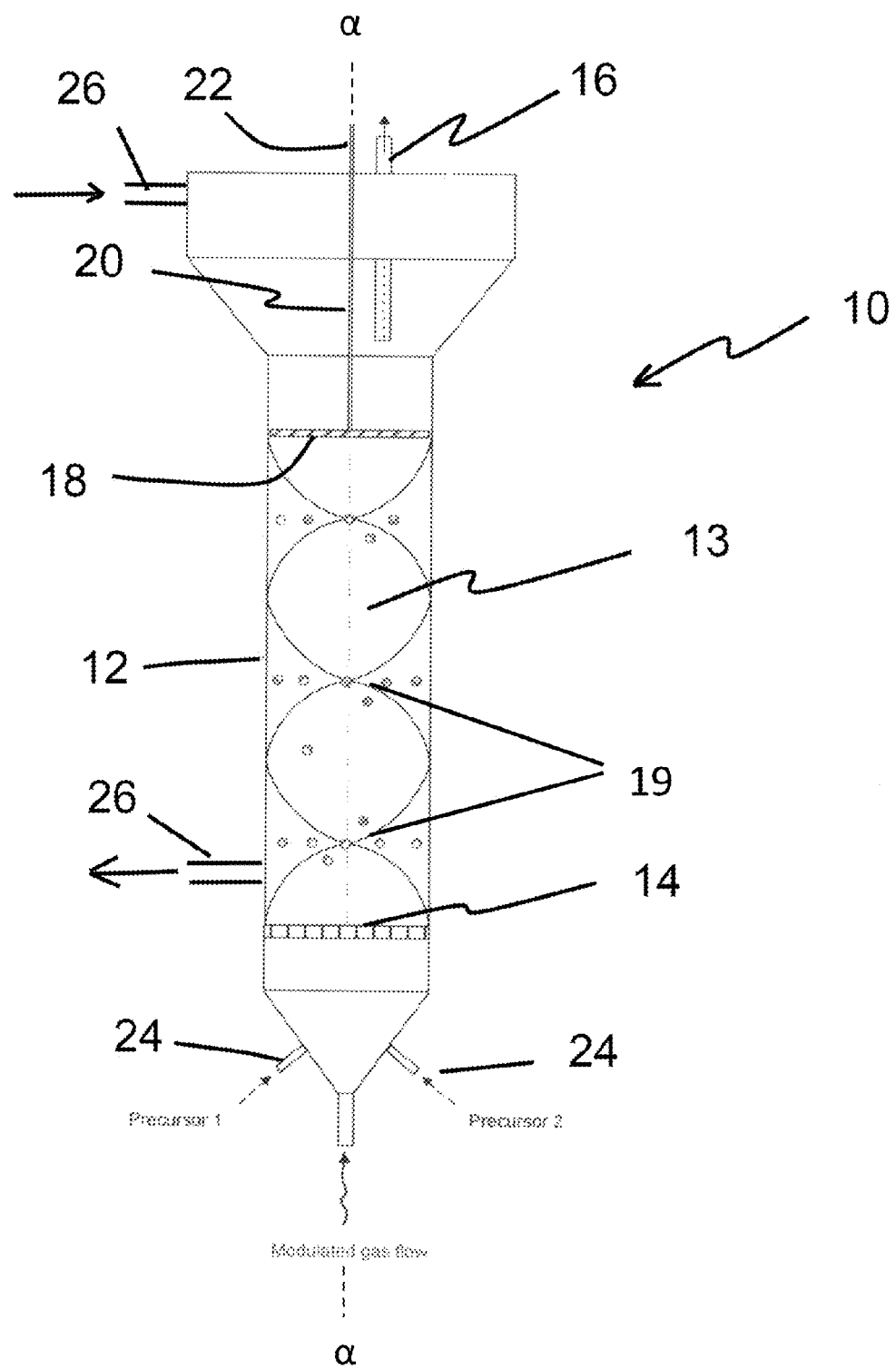
FIG. 2 is a diagram of standing wave assisted fluidized bed reactor, in accordance with features of the present invention.

An embodiment of the invented coherently-controlled gas-fluidized bed reactor is depicted in FIG. 2 and comprises the following:

A housing 12 of the reactor, such as is a column or sleeve composed of stainless steel, quartz, or some other inert substrate, so as to define the physical confines of the reaction zone. Specifically, the housing 12 serves to confine a fluidized bed with the interior 13 of the housing.

A gas distributor 14 is positioned within the housing, and near a first end of the housing. The distributor comprises a means for regulating ingress and egress of compressed gas to the interior of the housing. One such means is a substrate or webbing with a predetermined mean pore size, (e.g., about 10 microns) along with a top extension bed region as a means to slow down incoming gas. In an embodiment of the invention, a depending end of the housing, shaped as a cylinder, is constructed of sintered porous metal plate to provide an approximately uniform gas distribution. Optionally, the porous plate is covered or otherwise overlaid by thin metal mesh having a hole size smaller than the diameter of the granular particles comprising the fluidized bed. This serves as a means to impede the particles from clogging the underlying plate.

A plurality of porous filtering tubes 16 is installed at the top of the reactor. The tubes provide a means of egress of the reaction and/or product gases while simultaneously providing a means for keeping the target powder within the reactor. An inert gas is periodically injected in a back blast, counter current fashion through the tubes 16 to remove any powder adhering to the tubes or filters positioned within the tubes.

A plurality of apertures and associated conduits 26 are formed along longitudinally extending walls of the reactor and in close spatial relationship to the portions of the reactor confining the bed. These apertures provide a means of ingress (situated at an upwardly extending portion of the reaction chamber) and a means of egress (situated at a depending, i.e., a downwardly extending portion of the reaction chamber) of the powder to and from the reactor. The accompanying arrows shown proximal to elements 26 indicate the direction of particle flow. However, embodiments can exist where the particle flow is reversed. The apertures 26 facilitate loading and evacuation of the powders over the gas distributor, in either a batch or continuous mode.

A wave reflector 18 is positioned above the surface of the powder bed. This reflector, comprised generally of metal, glass, ceramic, plastic, or some other inert material (relative to the precursor moieties) defines a surface to reflect a wave impinging upon in. In an embodiment, the reflector is flat and elliptical in shape. The reflector provides a means for generating a standing wave of pressure. The reactor is configured so as to confine the standing wave between the gas distributor 14 and the wave reflector 18, the entire wave and its associated energy therefore confined to the interior 13 of the housing. The position of the wave reflector is adjustable from a remote location (e.g., from outside of the fluidized bed reactor) to optimize the wave field generated. In an embodiment of the invention, a means 20 for adjusting the wave reflector comprises a rigid substrate 20 attached to the wave reflector, the substrate comprising regions 22 adapted to be manipulated by hand, chuck or other mechanical means.

Standing Wave
Detail

The invention provides for spatial and/or temporal controlling of a dynamic process by using a modulating standing wave. A standing wave is a stationary wave that oscillates in time, but has a spatial dependence that is stationary, per the algorithm: $\sin(2\pi x/\lambda)$. Standing waves are created when the medium is moving in the opposite direction to the wave, or it can arise in a stationary medium as a result of interference between two waves traveling in opposite directions, such as the standing wave generated through interaction of the original wave with its reflected wave. In the second case, for waves of equal amplitude traveling in opposing directions, there is, on average zero propagation of energy. This feature is very useful and different from that for a travelling wave. Particularly, the self regulation function of standing waves in both the time and spatial domains provides a means for relegating primary powders to stay within multiple cells where strong self-generated vortex occurs and stirring naturally forms. This unique flow structure allows for the generation of uniform powder dispersion and/or smooth powder fluidization.

In an embodiment of the invention, initiation of a standing wave occurs when a superimposed oscillatory gas flow is injected into a gas-fluidized bed. In an embodiment of the invention, a single gas flow is utilized, such as nitrogen gas, the flow comprising a constant part and an oscillatory part. These parts are injected into the particle bed simultaneously. A means for generating the constant part and oscillatory part of the gas flow comprises a combination of a digitally controlled proportional value and a signal generator. The signal generator produces various electrical waves which are used to control the proportional value. Two components comprise the signal: a direct current (DC) component which supplies constant charge to the valve (and therefore a constant gas stream flow), and an alternating current (AC) component which varies with time to provide a pulsed or oscillatory electrical signal to the valve. This pulsed component generates the oscillatory portion of the gas stream. An exemplary algorithm for this two component electrical signal is as follows:

$$A + B \times \sin(\Omega \times T)$$

wherein A is the DC component, B is the AC component, $\Omega$ is the amplitude of the sine wave and T is the time. The inventors have found that by varying A, B and/or $\Omega$, the constant and oscillatory portions of the fluidized gas are varied to optimize particle fluidization and coating.

The standing wave is generated and confined between two fixed positions. As such, the energy embodied in the standing wave is focused within the mixing chamber and not transferred outside of the chamber.

The standing waves occur between two fixed positions, such as opposing sides of a reaction vessel. One way in which a standing wave is generated is when two waves, with identical frequency, travel in opposite directions in a stationary medium as a result of interference (e.g., reflected waves from walls or the ceiling and/or reflector of the reaction chamber). A schematic of this method is found in FIG. 2. The particles fill the entire bed space, with more particles staying at and near the nodes 19. Generally, the nodes are located at the intersection of adjacent pressure waves. In this instance, energy is focused within the bed for fluidizing particles between gas distributor and the wave reflector, rather than transporting particles across the entire reactor. A clear freeboard condition develops indicating that energy is focused within the bed for fluidizing particles, rather than transporting the particles across the entire reactor. The inventors have found that this generation technique is good for controlling ultra fine C powders, i.e., those particle with diameters of approximately 20 microns or less.

Figure 3:
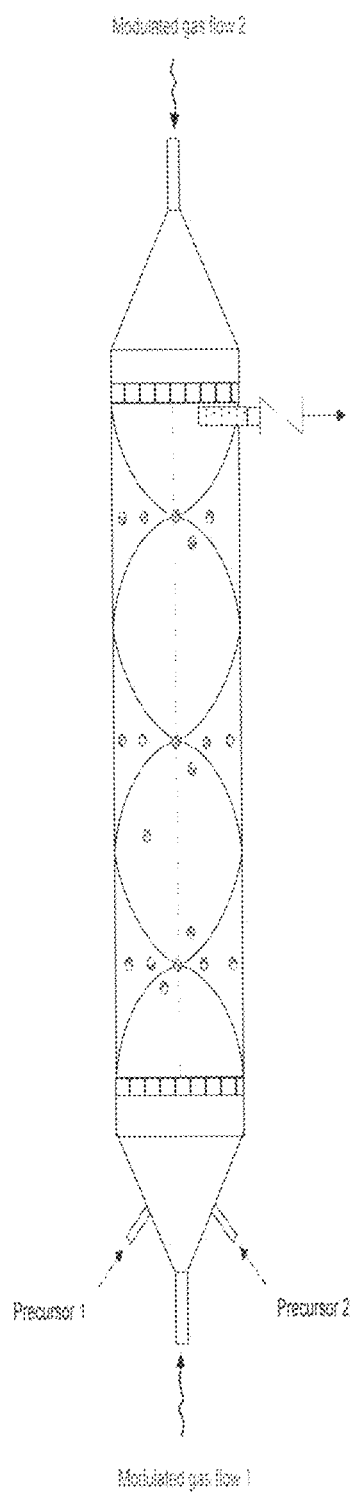
FIG. 3 is a diagram of a standing wave fluidized bed reactor using synchronized fluid waves, in accordance with features of the present invention.

Another embodiment of the invention generates a standing wave by simultaneously introducing two oscillatory flows with the same frequency from both the bottom and the top bed. This scenario is schematically depicted in FIG. 3. The advantage of this method is that the intensity of the standing wave formed can be larger than that formed when just one oscillatory flow is utilized with a reflecting surface.

Another way that standing waves are generated is when the particle medium moves in the opposite direction to a wave caused by the insertion and superimposition of inert fluid into the reaction chamber. This scenario results in improved particle suspension. The inventors found that this technique is good for controlling B/D powders, i.e., those powders of approximately 200-500 microns in diameter (B size) and more than 1000 microns in diameter (D size). The modulated fluid can be sine, square and other oscillatory fluid waves. These waves are generated in myriad fashion, for example by using a magnet- or electrically-controlled proportional valve or similar metering system.

Also, the waves can create vortex structures. This is because when a wave travels through a viscous medium, it interacts strongly with this medium, by which energy can be effectively transferred onto the medium. The inventors have found that for their invented gas-solid system, an increasing particle density results in system viscosity increases. When the resulting fluid is excited by a standing fluid wave, an uneven pressure distribution develops, resulting in a circulating patterned (vortex) structure.

The standing waves exhibit higher intensity (i.e., higher amplitude compared to the intensities of its originating waves. The establishment of standing waves indicates that the measured bed-pressure drop approaches the suspended particle bed weight. This causes a more homogenous suspension of substantially the majority of the particles within the reaction zone, concomitant with continual mixing of the particles (see FIG. 1A).

An advantage of using standing waves is that the energy is focused on the media comprising the wave, and not transferred to outside of the media. The antinode portion of the wave moves more than the node portion of the wave. Relative to the antinode portion, the node portion remains fixed within the wave medium. This is because at pressure nodes, the pressure is fixed. However, at the anti-nodes, pressure wave changes periodically between the maximum positive and negative peak pressures. It is due to this pressure difference between the node region and the anti-node region that creates conditions leading to vortex formation. The distance between two conjungative nodes or anti-nodes is $\lambda/2$.

The inventor has determined three mechanisms for generating a second wave from which standing waves result:

1. Exploitation of naturally-existing pressure waves in the axial direction in a gas-fluidized powder bed.
2. Reflecting waves in the radial direction (relative to the incident wave) reflective wave originating from the fluidized bed reactor wall.
3. Back reflecting the initial wave using a specially designed reflector, the back reflection traveling in the axial direction along the initial flow path.

Standing waves provide a pulsed power effect to the particles. In an embodiment, the standing wave fluid comprises compressed, pulsed nitrogen gas. However, other relatively inert gases are also suitable, including argon, neon, helium, and combinations thereof. The provision of pulsed fluid obviates the need for extra power sources or equipment to maintain the homogeneous dispersion of particles within the reaction chamber.

The distance between gas distributor and the wave reflector should be the integer times of half of the wavelength. Since gas flow velocity is determined mainly by particle fluidization and the wavelength needs to be shorter than the bed height to form a standing wave, the exciting frequency can be accordingly determined. As such, it is system dependent, normally in a low frequency (i.e., less than about 100 Hz, typically between about 1 and 50 Hz, preferably about 10 Hz) range.

The inventor has established a sequence of well-defined transitions between disordered states dominated by bubbling instabilities and ordered periodic sub-harmonic patterns as the frequency, the amplitude of modulation and the fluid flow rate are varied. The observed ordered states include periodic squares, stripes and some more complicated structures. The pattern wavelength is determined by the frequency of the modulation of the mean flow rate, as elaborated in J. Li, I. S. Aranson, W.-K. Kwok, and L. S. Tsimring, Phys. Rev. Lett. 90 (2003) 134301, the entirety of which is incorporated herein by reference. The transition to periodic patterns is associated with a decrease of the gas pressure difference across the bed, suppressing the formation of large gas bubbles.

Particularly, the inventor found that it is the superimposed flow that interferes with the granular bed layer when its frequency concurs with that of the bed layer, leading to pattern formation. For the nonequilibrium system of fluidized solid particles, there always exists a unique flow regime for which certain frequencies dominate. A cohesive (or adaptive) controlling strategy utilizes the bed's natural rhythm, making possible a high bed expansion, and thus improved particle dispersion and significantly suppressed interparticle collisions, yet with a much lower fluid or energy input. The bed's natural frequency can be measured or calculated from the literature such as H-T Bi, Chem. Eng. Sci. 62 (2007)3473, the entirety of which is incorporated by reference.

This coherently-controlled gas fluidization technique eliminates the need to rotate, jostle or otherwise move the reaction chamber. Rather, dispersion is achieved by contacting the particles to a standing wave. This results in homogeneous fluidization of the particles achieved at low energy and equipment costs. As such, the fluidized powder bed is kept moving solely by the applied fluid wave.

The inventor found that periodic variation of the pressure wave can occur by interfering with the reflected wave originating from the reflector surface, such as a side wall. This periodic variation leads to increased pressure fluctuations, and provides a means for preventing particle agglomerate formation. Homogeneous fluidizations of ultrafine powders in shallow beds are enabled. For the purposes of this specification, shallow beds have bed heights less than their reactor's diameters (H>D). In some embodiments, shallow bed heights are typically no more than 5 centimeters, such that the wall effect can be neglected.

With increasing bed height, where H>D, the inventors found that the wall-induced reflecting wave effect diminishes. In these instances, the standing wave is generated utilizing a wave reflector installed above the bed.

A modulated pressure-wave generator is used to drive the gas-solid suspension into a resonant standing wave state in the gas-fluidized bed region. An embodiment of the generator comprises a signal generator, amplifier, proportional valve and mass flow meter. The system produces a modulated oscillatory gas flow of fluid to to coherently fluidize primary powders in the gas-fluidized bed.

ALD Detail

The gas-phase surface adsorption of ALD precursors is a very rapid process and its rate-limiting step is determined by the contact chance of a precursor molecule locating a vacant nuclear site and reacting. In state of the art coating protocols, the aforementioned particle interactions resulted in protracted times for precursor molecules to reach their destinations, mainly because they are transported by diffusion through a torturous pathway. Heretofore, mass transfer has been very limited.

A precursor dosing system preferably includes dedicated lines for each selected precursor to the gas fluidized bed reactor. Each line can be composed of a mass flow controller, a precursor bubbler to hold the required reactant, ALD values located both ahead and after each bubbler to control precursor introduction, and a needle valve or vacuum controller located downstream of the bubbler to adjust outlet pressure. A bubbler-based dosing system is preferred for precursors with vapor pressures above about 1 torr at room temperature, so as to have adequate precursor exposure to assure conformal film growth.

For precursors having low vapor pressures (e.g. below about 1 torr), direct-liquid injection systems are preferred in which the liquid precursor is directly injected into a mixing/evaporation chamber for vaporization before entering the fluidized bed reactor.

Salient features of the invented system in which ALD is utilized includes the following:

A fluidized bed reactor, including a gas distributor/powder separator and the coherently controlled pulsing flow system.

A chemical precursor dosing system, such as a Labview®-controlled configuration.

Middle-level vacuum system (approximately 1 Torr) under an operating fluidization condition of about $3U_{mf}$.

System for monitoring coating processes and various species concentrations (such as on-line mass spectroscopy).

Temperature control system.

A gas-solid system operating under the middle-level of vacuum comprises a vacuum pump (Edwards Model: E2M80FX), chemical/particle traps, controlling valves, multiple vacuum transducers. The purpose of film coating under a vacuum condition is two fold: 1) to confine hazard precursors within the system, and 2) to facilitate film growth as molecules has good diffusion and flowability under such a level of vacuum, typically 0.001 torr<P<100 torr.

The ALD reaction typically occurs under a relatively low temperature, as compared to its CVD coating process. The gas-fluidized bed reactor needs to be heated to a certain temperatures, e.g. 500° C., 1) to remove moisture and volatile organics from the powder surfaces, and, e.g. 180° C., 2) to maintain the ALD reaction. Also, the precursor delivering lines are also needed to be heated with a temperature about 10° C. higher than that for the precursor bubbler to prevent any precursor condensation in the line.

The ALD coating process is a gas-phase reaction. Both reactants and products are in the gaseous type except the coated thin film. Preferably, a mass spectrometer provides an on-line and real-time measure and monitor of various gas species during the entire ALD-coating process. The partial pressure of the precursors also indirectly provides necessary information on whether primary powders expose enough.

ALD Precursor Injecting System Detail

An embodiment of the precursor injection system includes a plurality of means of ingress of the reactant moieties into the fluidized bed confines. FIG. 2 depicts two conduits 24, to provide the selected precursors to the gas-fluidized bed reactor. Each line can be composed of a mass flow controller, a precursor bubbler to hold the required reactant, two ALD valves located both ahead and after each bubbler to conduct open/close controlling, a needle vale or a vacuum controller located in the down streaming to adjust the outlet pressure; Such a bubbler-based dosing system is suited for precursors with high vapor pressure, e.g. >1 torr at room temperature. Otherwise, the partial pressure, or concentration, of the precursor would not be high enough to allow for a good film growth.

For precursors with low vapor pressures (ranging from about 0.001 to 1 torr at room temperature), a direct-liquid injection system is required by which the liquid precursor is directly driven into a mixing/evaporation chamber, and then it is vaporized before it enters the fluidized bed reactor. An adequate (based on theoretical mass balance of a certain volume or weight of particle loading) supply of a precursor is preferred since a significantly large amount of particle surface exists in a gas-fluidized bed. In continual operation, a continual supply of precursor is suitable.

The typical procedure for conducting an ALD-coating in a coherently-controlled gas-fluidized bed include: 1) surface pre-conditioning of primary particles by annealing particles at a high temperature of approximately 500° C. under vacuum for about 1 to 2 hours to clean any volatiles and/or free water that may be physically adsorbed on particle surfaces; 2) surface treatment of the primary particles by e.g. using $O_3$, to make available the required functional group, e.g. —OH, for initializing the ALD film growth; 3) alternative dosing of two chemical precursors in a six-step sequence:

a) precursor 1, e.g. $Al(CH_3)_3$, or $Zr[N(CH_3)(C_2H_5)]_4$ b) inert gas (e.g. $N_2$) purging, c) a short period of vacuum exposure (no gas entering), d) precursor 2, e.g. $H_2O$, e) inert gas $N_2$ purging, and f) a short period of vacuum exposure (no gas entering).

Among the steps, inert gas purging and vacuum exposure are specifically designed to make sure that no former precursor would remain within the system, thereby preventing any CVD-like deposition since a CVD-type of deposition deteriorates the quality of the ALD ultrathin film.

Controlling of the precursor dosing is conducted via a series of gas activated diaphragm valves, which are automatically executed by using an ALBVIEW computer program. Various operating parameters can all be specified in the program, including flow rate of carry gases, dosing times, interval purging periods, vacuum exposure times, and total coating cycles. In addition, a gas-activated diaphragm valve is also installed for each precursor dosing line at the entrance of the gas-fluidized bed reactor to seal the precursor line when it is during its "off" period such that a potential inter-precursor contamination can be prevented. Also, this valve is synchronized with the other two ALD diaphragm valves in the same precursor line. Moreover, a needle bellow valve is installed as well in the downstream of the bubbler for each precursor line to regulate the outlet pressure.

High purity $N_2$ from a pressurized gas cylinder, which acts as both fluidizing and a purging gas, is introduced into the gas-fluidized bed. A mass flow meter (e.g., an Aalborg, Model GFMS series) is used to measure the $N_2$ flowrate. A proportional valve that is electronically controlled by a function generator (e.g., a Textronix Model AFG3000) is used to generate flow/pressure fluid modulation such as gas modulation. Gas modulation is generated by any pulsing generation methods (for a fluid), such as a gas pump, or using a gas modulation system composed of gas cylinder, proportion valve, and function generator. Such a modulated flow is maintained in the gas-fluidized bed reactor for the entire coating process except the short periods of vacuum exposure in step c and f in the sequence, in which case the modulated flow is switched to bypass the reactor. A well-defined modulated gas flow is achieved by manipulating the gas cylinder outlet pressure or inlet fluidizing pressure via the fluid modulation system as described supra.

As the intensity of a pressurized gas can be much stronger, and straightforward than that generated by a sound (acoustic and ultrasonic) source or a mechanical vibration, a modulated fluid wave is capable of generating a much more effective modulated pressure filed in a modulated gas-fluidized bed. When the modulated pressure wave approaches the reflector in the fluidized bed, it is reflected back to resonantly react with the original wave to form a standing wave. As a result, the flow modulation can be further enhanced, enabling to effectively regulate the fluid-particle system in both spatial and temporal domain to form a highly homogenous two-phase flow field, or the uniform particle dispersion in a gas flow.

In essence, compressed fluidizing gas provides the energy to overcome interparticle forces and gas channels, thereby allowing the reactor body to remain motionless. These forces include electrostatic interactions and van der Waals forces.

Another embodiment of the invention utilizes acoustic-assisted fluidization through levitation.

The invented method is applicable to enable powder-related applications where uniform particle dispersion is required. For example, the method facilitates the production of conformal surface coatings of granular materials via atomic layer deposition in a gas-fluidized bed reactor. This will enable large scale production (i.e., batches of 500 grams initially, and 5 kilograms with further scale up) of functionalized particles for use in Li-ion batteries, super capacitors, catalysts, nanocrystal solar cells, and other applications where enhanced surface area between catalyst and reactants are crucial.

In an embodiment of the method, a modulated superimposed fluid wave is coherently applied to a gas-fluidized powder bed. The fluid wave is introduced in the reaction environment upstream from the ingress point of the reactants. At the downstream end of the environment, a wave reflector is installed in the flow path of the fluid wave.

The provision of the wave reflector facilitates the formation of the aforementioned standing wave. In an embodiment of the invention, the standing wave is generated by interference between a traveling wave and its reflective wave. The standing wave generated thereby confines the fluidized particles to particular zones of the fluidized bed. Generally, the standing wave is generated by triggering resonance with the system's boundaries, such as a reactor side wall or a top reflector surface. Alternatively, a standing wave can be generated by inducing resonance with the complex fluid system itself in situations where a natural frequency within the fluid system either interferes with multiple waves traveling in opposite directions within the system or else the natural frequency results from fluid moving in the opposite direction to the imposed wave.

Particle Detail

A wide variety of particulate materials can be used as the host substrate. In this invention, dielectric, semiconductor and metal materials are the most typical base materials. The base powder material includes metal, semiconductor, and dielectric and ceramics, e.g. Li—Mn—O spinel cathode and its composite materials. The sizes of such powders are preferably less than 100 microns; more preferably is less than 20 microns.

Exemplary host materials include: 1) lithium transition metal oxides and graphite/graphene that are used for Li-ion battery electrodes; 2) dielectric materials for super-capacitors; 3) semiconducting materials for the next generation of solar cells and LEDs; and 4) metals for a spectrum of chemical reaction catalysts as applied typically in petroleum refining, biomass pyrolysis and many other areas. Other related base materials can be nano-constructed (wire, tube or particle) composite materials, like carbon fiber reinforced plastic materials. All granular materials, in general, that need surface modification to have a new function are all in the category of this invention, acting as base materials for such ALD-coating technology.

The size of the host particles largely depends on the particular material and its specific application. The particle size suited can be up to 100 microns, e.g. typically for catalyst applications, with preferred particle sizes ranging from 0.1 to about 10 microns typically for Li-ion battery applications, and more preferred particle sizes ranging from 1 to about 100 nm, e.g. for the next generation of photovoltaic cell or LEDs applications, and the most preferred particle sizes ranging from about 1 to 60 nm, or less than a specific dimension as defined by Bohr diameter of that base material, e.g. the exciton Bohr radius for PbSe is 46 nm. This size range is of particular interest since the materials constructed thereby exhibits a lot of new and exciting physical properties and unprecedented functions, leading to new material discoveries and technology breakthrough. Moreover, this ALD-CCGFB coating process can also be applicable to particles having diameters more than 100 microns.

Fluidization Example 1

Figure 4:
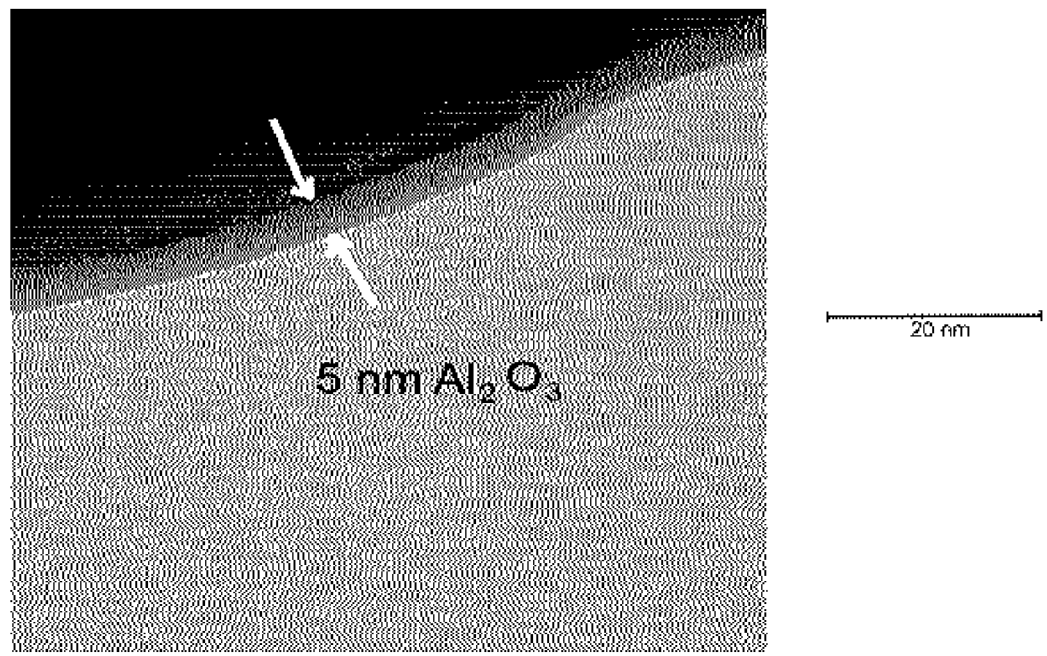
FIG. 4 is a photomicrograph of an alumina-coated cathode, in accordance with features of the present invention.
Figure 4:
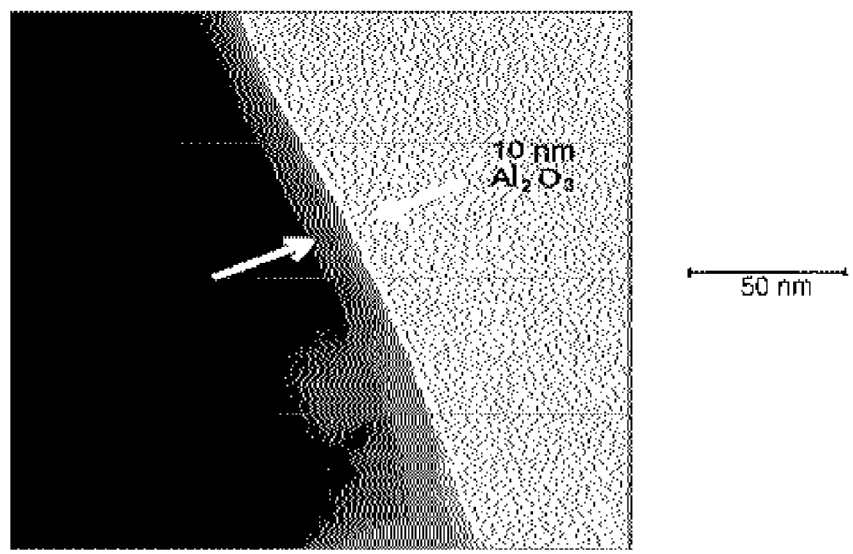
Figure 5A:
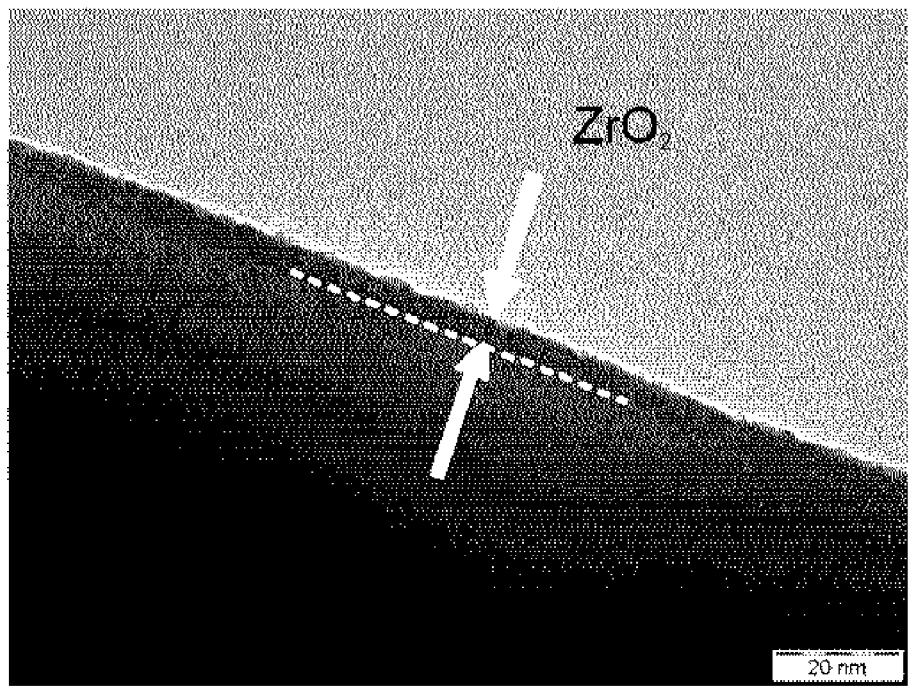
FIGS. 5A and 5B are photomicrographs of a zirconia-coated particle, in accordance with features of the present invention.
Figure 5B:
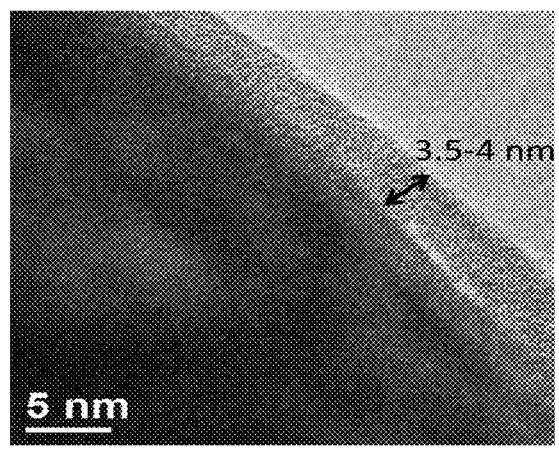

Li-ion cathode particles, having a means size of between about 5 and 10 microns, were homogenously fluidized. The tap density was about 2 to 2.8 $g/cm^3$. (Tap density is the powder density measured after the powders are tapped for a certain period of time while residing in a graduated cup, cylinder, container or other volume measuring means. The wave frequency was about 3 Hz using about 12 pounds per square inch (psi) inlet $N_2$ pressure and atmospheric bed pressure. The fluidization occurred in a laboratory-scale sized fluidized bed having approximately a 4 centimeter outside diameter. Both atmospheric and vacuum conditions produced suitable alumina and zirconia coatings, as depicted in FIG. 4 and FIGS. 5A and 5B, respectively, and discussed supra. Stable fluidization endured until the wave media feed was stopped.

Fluidization Example 2

$LiNi_{0.5}Mn_{1.5}O_4$ particles of approximately 5 to 10 microns were fluidized. The wave frequency was about 3 Hz. Approximately 12 psi nitrogen pressure and a vacuum bed pressure (2 torr) was utilized. (Typically, frequencies between about 1 and 10 Hz are preferred.) The inventor discovered that stable fluidization occurs under both atmospheric and vacuum conditions for several hours until the gas flow is terminated.

Example 3

Ultrafine particles are also partially homogenized via ultrasound waves. In this example, iron powder between about 1 to 10 microns in particle diameter are fluidized using 250 kHz frequencies, and at about 170 dB in sound intensity. This sound intensity represents the amplitude of the ultrasonic wave. Generally, between 100 dB and 200 dB are suitable acoustic frequencies for ultrasonic mixing of the particles. Compared to fluid modulation discussed supra, the sound wave approach imparts lower pressure intensities.

In all examples, a wave reflector is utilized. Also in all examples, evidence of homogenous dispersion was an observed by either visualizing the powder fluidization (by looking through the walls of the reactor container when quartz reactors are utilized), by noting pressures drop across the fluidized bed, (which result from a suspended bed weight), by calculating the suspended particle density, or a combination of these means. The process continued until the wave fluid was terminated. This compares to a relatively short fluidization time seen in conventional bed reactors (which do not employ standing waves) due to the lack of particle surfaces.

The invented fluidization technique is used to enable ALD-coating of metal oxides on Li—Ni—Mn—O particles. In an embodiment of the invention, the ALD precursors are introduced upstream from where the wave fluid (such as nitrogen gas) is introduced. In another embodiment, the ALD precursors are introduced downstream from where the wave fluid is introduced.

Coating Film Detail

A variety of ultra-thin coatings can be deposited onto the surfaces of the primary particulate materials. The thin coating material includes metal, nitrides, and metal oxides, e.g. $ZrO_2$, and $Al_2O_3$. Thickness of the coated layer is between about 0.1 and 100 nm, preferably between about 0.1 and 10 nm, and most preferably more than 0.2 nm but less than about 3 nm. Some exemplary coating materials and the related precursors are shown in Table 1.

TABLE 1

Coating Candidates for particle encapsulation.

| Deposited materials | Precursor |
|---|---|
| $Al_2O_3$, AlN, Al | Aluminum sec-butoxide Aluminum tribromide Aluminum trichloride Diethylaluminum ethoxide Tris(ethylmethylamido)aluminum Triethylealuminum Triisobutylaluminum Trimethylaluminum Tris(diethylamido) aluminum Tris(ethylmethylamido) aluminum |
| $MgB_2$, BN, B, $B_4C$, $B_2O_3$, B doping | Diborane [B2H6, gas] Trimethylboron [(CH3)3B, gas] |
| Co, CoO, CoSi2 | Bis(N,N'-Diisopropylacetaminato)cobalt(II) Dicarbonyl(cyclopentadienyl) cobalto(I) |
| Cu, CuO | (N,N'-Diisopropylacetaminato)copper(II) |
| $CaF_2$ $LaF_3$, $SrF_2$, $ZnF_2$, $MgF_2$, $YF_3$ | TiF4 TaF5 NH4F |
| Fe, FeO | Bis(N,N'-di-tert-butylacetamidinato)iron (II) |
| Ga2O3, Ga, GaN, GaP, GaAs | Gallium tribromide Gallium trichloride Triethylgallium Triisopropylgallium Trimethylgallium Tri(dimethylamido)gallium Tri-tert-butylgallium |
| Ge, $GeO_2$, GeSi | Digermane Germane Tetramethylgermanium |
| HfO2, Hf3N4 | Hafnium (IV) chloride Hafnium (IV) tert-butoxide Tetrakis(diethylamido)hafnium (IV) Tetrakis(dimethylamido)hafnium (IV) Tetrakis(ethylmethylamido)hafnium (IV) |
| $In_2O_3$, InN, InP, InAs, Indium Tin oxide | Indium trichloride Indium(I) iodide Idium acetylacetonate Triethylindium |
| GaN, $Si_3N_4$, InGaN, AlGaN | N,N-dimethylhydrazine Ammonia Azidotrimethylsilane |
| MgO | Bis(ethylcyclopentadienyl)magnesium |
| Nb2O5 | Niobium (V) chloride Niobium (V) ethoxide |
| Ni, NiO | Bis(methylcyclopentadienyl)nickel (II) |
| InP, GaP | Phosphine Tert-Butylphosphine Tris(trimethylsilyl)phosphine |
| Pt, PtO2 | Cyclopentadienyl(trimethyl)platinum (IV) |
| Ru, RuO2 | Bis(ethylcyclopentadinyl)ruthenium (II) |
| Sb source | Trimethylantimony Tris(dimethylamido)antimony |
| $SiO_2$, $Si_3N_4$, SiC | 2,4,6,8-tetramethylcyclotetrasiloxane Dimethoxydimethylsilane Disilane Methylsilane Octamethylcyclotetrasiloxane Silane Tris(isopropoxy)silanol Tris(tert-butoxy)silanol Tris(tert-perntoxy)silanol |
| Ta2O5, TaN | Pentakis(dimethylamido)tantalum (V) Tantalum (V) chloride Tantalum (V) ethoxide Tris(diethylamino)(ttert-butylimido)tantalum (V) |
| TiN, TiO2 | Bis(diethylamido)bis(dimethylamido)titanium (IV) Tetrakis(diethylamido)titanium (IV) Tetrakis(dimethylamido)titanium (IV) Tetrakis(ethylmethylamido)titanium (IV) Tatanium (IV) bromide Tatanium (IV) chloride Titanium (IV) tert-butoxide |
| V2O5 | Vanadium (V) oxytriisopropoxide |
| W, $WO_2$, $WO_3$, WC | Bis(tert-butylimido)bis(dimethylamido)tungsten (VI) Tungsten hexacarbonyl Tungsten (VI) chloride Tungsten (VI) fluoride |
| Y2O3, YBaCuOx | Tris(N,N-bis(trimethylsilyl)amide)yttrium (III) Yttrium (III)butoxide |
| ZnO | Diethylzinc |
| Zr3N4, ZrO2 | Tetrakis(diethylamido)zirconium (IV) Tetrakis(dimethylamido)zirconium (IV) Tetrakis(ethylmethylamido)zirconium (IV) Zirconium (IV) bromide Zirconium (IV) chloride Zirconium (IV) tert-butoxide |

The inorganic deposits formed in the ALD process may take the form of individual particles, or a continuous film. The physical form of the deposits will depend on factors such as surface pre-treatment of the primary particles, the physical form of the substrate, and the number of times the reaction sequence is repeated.

For ALD coating, three physical parameters are unique and essential to a good film quality: firstly, the deposits of inorganic material are "ultrathin". "Ultrathin" is defined herein as a thickness of the deposit up to 50 nm, preferably from about 0.1 to about 10 nm, and most preferably from about 0.5 to about 3 nm (i.e. monolayer and/or a few atomic layers). This can be done by simply specifying the cycle number of the deposition.

Secondly, the deposits of inorganic material preferably form a "conformal" coating. "Conformal" is defined herein as the thickness of the coating being relatively uniform across the surface of the particle, so that the surface shape of the coated substrate closely resembles that of the underlying substrate surface. Conformality can be determined by methods of direct observation, such as AFM, or transmission electron spectroscopy (TEM) that have resolution of 1 nm or below. The desired substrate surface is preferably coated substantially without pinholes or defects. This can be controlled by 1) self-termination for the half reaction and 2) enough exposure to the precursors.

Thirdly, primary particles have to be exposed enough to both precursors. "Exposure" is especially defined, in surface chemistry, as product of partial pressure of a reactant and the resident time to quantitatively characterize this process. Since it is, usually, not realistic for a precursor to reside in the gas-fluidized bed for an extremely long time from the economic point of view even though a fluidized bed can have a wide resident time distribution, it is, therefore, essential to maintain a high enough precursor partial pressure in the gas-fluidized bed. As such, a suitable precursor delivery system provides the precursor adequate exposure time for a good film growth, particularly as fluidized powders have significantly-large specific surface areas, as compared to the cases for a traditional ALD coating process. Normally, the exposure for a gas-fluidized bed should be no less than about $10^6$ Langmuir. Ideally, it should be in the range of about $10^6$ to $10^8$ L.

Preferably, a pre-heating of the primary particles is conducted to remove any volatile organic absorbents and free water. Optionally, ozone pre-treatment to initialize the functional group on powder surfaces can help film growth, said pretreatment done in situ, which is to say within the gas-fluidized bed reactor. Examples of these functional groups include hydroxyls, (—OH), Halides (—X), amides (—NH3), —COOH, Alkyls (—R), alkoxides (—OR), and combinations thereof.

Coated Particle Detail

The invented process enables the formation of a coated particle that is preferably uniform disperse after the coating material is deposited. "Uniform disperse" particles do not form significant amounts of agglomerates during the process of coating the substrate particles with the inorganic material. Particles are considered to be a uniform disperse when (a) the average particle size does not increase more than about 5%, preferably not more than about 2%, more preferably not more than about 1% as a result of the coating. The only increase of particle size should be attributed to the coating itself. As such, for micro-scale particles (i.e., particles between about 1 and 100 microns in diameter) particle size increases as a result of coating thicknesses are negligible.

A feature of the invention is that the depositing process occurs at a molecular scale in gas phase. This enables the reactants to diffuse into the surfaces of individual particles. As such, those surfaces located inside very small pores of the primary particles also are coated. Consequently, despite the formation of these loose agglomerates, all surfaces of the particles, both outside and inside, are fully coated. The result is that all individual particles, as opposed to agglomerates comprised of particles, are coated. The invented method to provide a highly uniform fluidization of the primary particles enables this complete coating process.

When alumina was used as a coating for cathode particles in the ALD protocol, capacity retention of the battery improved. FIG. 4 is a photomicrograph of the alumina layer over $LiNi_{1/3}Co_{1/3}Mn_{1/3}O_2$ spinel. Preferably, alumina coatings of less than 5 nm provide optimal results, when voltages of more than about 3.5 V are utilized and temperatures of about 55° C. exist.

An exemplary ALD-coating of $ZrO_2$ ultrathin film was fabricated using the invented coherently-controlled gas-fluidized bed reactor. The number of ALD coating cycles varied, depending on the thickness of the zirconia. (A cycle is defined as a four-step sequential ALD process comprising two reactant doses and two inert gas purges. Typically one cycle generates about a 0.08 to 0.15 nm thick film). In one coating experiment, 40 cycles were used to generate about a 5 nm thick coating, while 80 cycles were used to generate a 10 nm coating. The growth rate was approximately 1.2 Angstroms per cycle, with the temperature maintained at about 200° C.

The SEM and TEM images, as shown in FIGS. 5A and 5B, for the coated particles indicate that an ALD-coated $ZrO_2$ ultrathin film on surface of $LiNi_{1/3}Co_{1/3}Mn_{1/3}O_2$ cathode particles was obtained. The 4 nm film is amorphous, and highly conformal. For the coating depicted in FIGS. 5A and 5B, 50 cycles were utilized to generate the film, with 150 grams of Li—Co—Ni—Mn—O particle material maintained at about 180° C. in the gas-fluidized state.

In summary, the invention provides a gas-fluidization technique and device for homogeneously dispersing ultrafine powders (e.g., less than 20 micrometers) in gas flows and stably fluidizing ultra fine powders via the utilization of standing waves in a gas-fluidized bed. Particle masses of at least 200 grams per batch are regularly processed, with 1-5 kilogram masses achievable with scale up.

Figure 6:
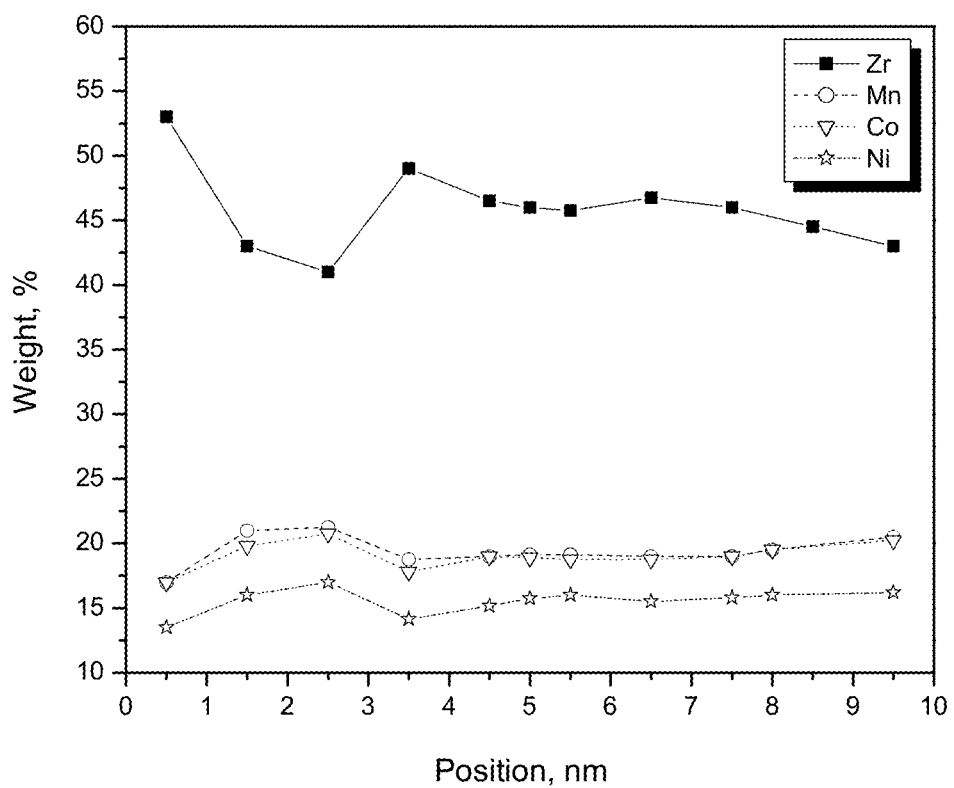
FIG. 6 is an element and weight profile analysis of zirconium distribution on a substrate, in accordance with features of the present invention.

FIG. 6 provides an element and weight profile analysis for the aforementioned zirconium-coated spinel. The ordinate on the graph designates weight percents of the various elements of the coated construct. The abscissa on the graph designates the various positions along the construct for which the weight percents are found. The graph shows a relatively constant weight percentage for each of the elements along a distance of the coated substrate.

A standing wave in a 3-D deep gas-fluidized bed is generated by using a wave reflector above the suspended powder bed in conjunction with a modulated gas flow.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property or privilege is claimed is defined as follows:

1. A method for dispersing particles within a reaction field in a reaction chamber, the method comprising confining the particles to the reaction field using a standing wave of fluids which is produced by providing a modulating fluid flow into the reaction field.

2. The method as recited in claim 1 wherein the wave comprises an inert fluid.

3. The method as recited in claim 1 wherein the fluid has a frequency of between about 1 and 50 Hz.

4. The method as recited in claim 1 wherein the fluid wave is coherently applied to a gas-fluidized particle bed.

5. The method as recited in claim 1 wherein the fluid is pressurized.

6. The method as recited in claim 1 further comprising contacting the particles with coating moieties.

7. The method as recited in claim 1 wherein the standing wave interacts with the reaction chamber defining the reaction field.

8. The method as recited in claim 7 wherein the standing wave is the product of fluids interacting with the sides of the reaction chamber, or the ceiling of the reaction chamber or a combination of the sides and ceiling.

9. The method as recited in claim 7 wherein the standing wave is the product of the fluids interacting with a reflector surface positioned within the reaction chamber.

10. The method as recited in claim 7 wherein the reaction chamber remains motionless.

11. The method as recited in claim 1 wherein the particles are more than approximately 10 nm and less than approximately 100 μm in diameter.

12. The method as recited in claim 11 wherein the particles are different sizes.

13. The method as recited in claim 1 wherein the standing wave is formed when an inert fluid coherently interacts with a fluidized bed containing the particles.

14. The method as recited in claim 13 wherein the inert fluid is injected into the reaction field.

* * * * *

UNITED STATES PATENT AND TRADEMARK OFFICE
CERTIFICATE OF CORRECTION

PATENT NO. : 8,936,831 B2
APPLICATION NO. : 13/366162
DATED : January 20, 2015
INVENTOR(S) : Jie Li and Yung Y. Liu It is certified that error appears in the above-identified patent and that said Letters Patent is hereby corrected as shown below:

Title page item (74), change "Cherskof Flaynik & Gurda, LLC" to -- Cherskov Flaynik & Gurda, LLC --

Signed and Sealed this
Twenty-eighth Day of April, 2015

Michelle K. Lee
*Director of the United States Patent and Trademark Office*